United States Patent [19]
Kniepkamp

[11] 3,816,270
[45] June 11, 1974

[54] METHOD OF PRODUCING THICK SCHOTTKY-BARRIER CONTACTS

[75] Inventor: Hermann Kniepkamp, Munich, Germany

[73] Assignee: Siemens Aktiengesellschaft, Berlin and Munich, Germany

[22] Filed: Dec. 9, 1971

[21] Appl. No.: 206,280

[30] Foreign Application Priority Data

Dec. 11, 1970 Germany .......... 2061202

[52] U.S. Cl. .......... 204/15, 117/212, 117/217, 117/218, 96/36.2, 96/38.4, 204/38 R

[51] Int. Cl. .......... C23b 5/48

[58] Field of Search .......... 117/227, 201, 212, 217, 117/218; 317/234 M, 235 UA; 96/36.2, 38.4, 47; 204/23, 35 R, 38 R, 15

[56] References Cited

UNITED STATES PATENTS 3,492,546 1/1970 Rosvold .......... 317/234 M 3,528,090 9/1970 Van Lear .......... 317/234 M

*Primary Examiner*—Cameron K. Weiffenbach

*Attorney, Agent, or Firm*—Hill, Sherman, Meroni, Gross & Simpson

[57] ABSTRACT

Method of producing precise relatively thick metal-semiconductor contacts (Schottky-Barrier contacts) comprising, applying a layer of a photosensitive resist material onto a semiconductor surface having discrete metal areas thereon, subjecting the resist layer to controlled amounts of light so that the areas of the resist overlying metal areas are rendered soluble while other areas thereof remain insoluble, removing the soluble areas of the resist layer, applying a protective layer, as of metal, onto the exposed metal areas, and then removing the insoluble areas of the resist layer.

8 Claims, 5 Drawing Figures

INVENTOR
Hermann Kniepkamp
BY
Hill, Sherman, Meroni, Gross & Simpson
ATTYS.

INVENTOR.
Hermann Kniepkamp

BY Hill, Sherman, Meroni, Gross & Simpson
ATTORNEYS

METHOD OF PRODUCING THICK SCHOTTKY-BARRIER CONTACTS

BACKGROUND OF THE INVENTION

1. Field of the Invention

The invention relates to methods of building up precisely defined electrically conductive areas on a substrate and more particularly to methods of building up precisely defined areas of metal on a semiconductor sample, i.e. Schottky-Barrier contacts.

2. Prior Art

It is known that precise metal areas are required on surfaces of semiconductor samples in the production of semiconductor devices particularly in the production of Schottky-field-effect transistors. Prior art has encountered problems in producing semiconductor devices having extremely detailed and/or precise metal areas on semiconductor wafers or samples where the spacing between parallel metal areas (such as conductive paths) is less than about 5$\mu$m and typically is about 1$\mu$m. Such closely spaced-apart metal areas must be completely out of contact with adjoining metal areas, except via the semiconductor sample Typically, a metal area on a semiconductor sample may have a width of less than 1$\mu$m and be spaced about 1$\mu$m from an adjoining metal area so that there is no direct electrical contact between such areas. Production problems are particularly noticeable in the manufacture of metal-semiconductor contacts (Schottky-Barrier contacts) on semiconductor samples, for example, composed of gallium arsenide. With these type of contacts, it is important to insure that no intermediate layers, particularly oxide layers, are formed between the semiconductor surface and the metal areas being applied. Schottky-Barrier contacts, such as of chromium, have been produced with fair success on gallium arsenide substrates. However, difficulties have been encountered in etching chromium layers on semiconductor surfaces to produce the discrete or precisely defined metal areas required. Certain methods of etching a chromium layer on a semiconductor sample are set forth in my copending applications U. S. Ser. No. 200,900, filed on Nov 22, 1971, and U. S. Ser. No. 201,886, filed on Nov. 24, 1971.

Precisely defined metal areas, such as composed of chromium, are extremely thin, for example, 50 to 100 nm (nano meters) in thickness and accordingly have an extremely high electrical resistance. Electrical resistance of a metal area can be decreased by increasing the cross-sectional area thereof. Thus, the electrical resistance of relatively thin precisely defined metal areas on a semiconductor sample may be decreased by depositing a metal, such as gold, copper, silver, etc. thereon. However, it is necessary to precisely mask or cover the uncoated semiconductor surface areas between the metal areas, and it will be appreciated that the uncoated semiconductor surface areas are also extremely detailed and/or precise, so that only the metal areas are thickened or increased in cross-sectional area by galvanic or electrolytical deposition.

The invention overcomes at least some prior art problems and provides methods of masking very precise non-metallized areas of a substrate so that metallized areas thereof can be thickened. The invention has particular utility for increasing the thickness of discrete precisely defined and extremely detailed metal areas on semiconductor surfaces and also has utility for thickening coarser metal areas on semiconductor substrates.

SUMMARY OF THE INVENTION

The invention provides for the production of relatively thick but very precisely defined, relatively small metal-semiconductor contacts (Schottky-Barrier contacts) comprised of precisely defined, extremely detailed metal areas on a semiconductor sample. The semiconductor sample may be composed of a compound selected from the group of III–V-compounds such as gallium arsenide or of silicon. Relatively thin surface areas of chromium or an alloy thereof on such a sample are thickened with a relatively thick layer of a select material, generally a metal.

In accordance with the principles of the invention, a semiconductor sample having relatively thin precise chromium or the like areas thereon is uniformly coated with a layer of a photosensitive lacquer (i.e. a photoresist) having a steep light gradation characteristic. Such a photo sensitive lacquer has a very sharply defined threshold at which the lacquer may be rendered exposed, i.e. in the case of a positive resist rendered soluble. The resist layer is exposed to light of controlled wavelength, intensity and duration until that lacquer overlying the metallized conductive paths on the semiconductor substrate is rendered exposed. The lacquer overlying the metalized electrically conductive paths on the semiconductor substrate is rendered soluble before the solubility of the lacquer overlying the substrate itself is affected due to the fact that the substrate itself has high light absorption and low light reflectance characteristics while the metalized conductive paths have high reflectance characteristics so that light impinging on these areas is reflected back into the lacquer. The soluble areas of the resist layer are removed to expose the precise chromium areas and a select material, usually a metal, is applied onto the chromium areas, preferably by electrolytic or galvanic process. The insoluble resist layer areas are then removed.

In one embodiment, a thin partially light-permeable layer of metal is applied onto the unexposed resist layer for further reflection of light within the resist layer so that a greater difference exists between the resist areas disposed between the metal areas directly on the semiconductor surface and the metal layer overlying the resist layer and the resist areas disposed between uncoated semiconductor surface areas and the metal layer overlying the resist layer. On light exposure, the resist areas between metal layers are subjected to a multiple passage of light (i.e. as by reflection) while the resist areas between the semiconductor surface and the overlying metal layer are subjected to a single passage of light.

DESCRIPTION OF THE PREFERRED EMBODIMENTS

Figure 1:
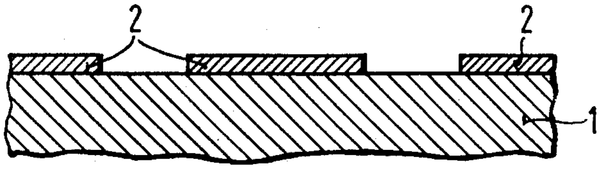
FIG. 1 is a diagrammatically sectioned partial view of a semiconductor sample having discrete areas of metal thereon useful in the practice of the invention.

The invention is particularly useful in building up or thickening as by depositing further material, for example by an electrolytical deposition or a galvanic deposition of a metal on fine or detailed metal areas, preferably composed of chromium or a chromium alloy on a semiconductor sample. The semiconductor sample is composed of a material selected from III–V-compounds and silicon. Preferably, the semiconductor sample is composed of gallium arsenide. The above semiconductor materials are characterized by having relatively low light reflection and high light absorption characteristics with respect to light radiations having wave lengths less than 350 nm to 450 nm. Radiation of such short wave length is sufficient to cause a photochemical reaction in a photosensitive resist.

In its broader aspects, the invention comprises coating a layer of a photosensitive resist (a chemical mixture which undergoes a chemical change when exposed to certain wave lengths of light) onto a semiconductor samples having discrete precisely defined areas of metal thereon. The resist material is selected so as to have a steep gradation to light, i.e. an exposure characteristic such that light energy below a certain threshold does not expose it but the resist is rendered soluble when subjected to light energy above such threshold. By "adequately exposed" it is meant that in the case of a positive photo resist material the resist is rendered completely soluble above a given light level and remains substantially insoluble below that light level. In the case of a negative resist, of course, the opposite is true. The characteristic of the resist material is referred to herein by stating that the resist has a steep gradation to light. The resist layer is exposed to controlled light, such that the duration, intensity and/or wave length are selected in harmony with each other so that the effect of light on resist layer areas where the light repeatedly passes (as by reflection from the discrete areas of metal) is to chemically change the resist in such areas so as to be soluble to its developer. Thus, after exposure to controlled light the resist layer areas corresponding to the discrete metal areas on a semiconductor sample are rendered soluble and are removed. The resist layer areas that are subjected to a lower level of light intensity only remain insoluble and protect the underlying semiconductor surface. Due to the low reflection and high absorption of light by the semiconductor materials, such insoluble areas are very precisely defined and correspond exactly to the semiconductor surface areas free of metal. Resist materials having the steep light gradation (i.e. having their solubility characteristics altered almost completely at a given light level) permit the process to be performed satisfactorily over wider ranges of light intensities.

In certain embodiments of the invention, the resist layer may remain on the metal areas of a semiconductor sample and not on the semiconductor surfaces free of metal, and in such embodiments a negative resist material is utilized.

Photosensitive resists are organic solutions, which when exposed to light of a proper wave length are chemically changed in their solubility to certain solvents (developers). Two types of resists are known and generally available, negative- and positive- resists. The negative- resist is initially soluble in its developer but after light exposure, becomes polymerized and is insoluble to the developer. Positive resists work in the opposing fashion, light exposure makes the resist material soluble in its developer. Positive- resists are exemplified by AZ (a trademark) resists, while negative-resists are exemplified by KPR (a trademark) resists. A resist pattern that remains after development is inert to plating, etching, etc. The remaining resist pattern is removed by subjecting such pattern to organic solvents and/or commercial strippers, such as acetone, ketones, ethyl acetate, cellulose, strong alkaline solutions etc. Workers in the art are aware of such resists as well as their developers, as exemplified by the references Printed Circuit Handbook, Clyde F. Coombs, Jr., (Editor) (McGraw-Hill Book Co.) 1967, pages 4–11, et seq.; U. S. Pat. Nos. 3,046,120 or 3,046,121 and other like references, which references are incorporated herein.

The precisely defined metal areas on a semiconductor substrate which are thickened in accordance with the principles of the invention are composed of a highly reflective metal, preferably of chromium or a chromium alloy. The reflective characteristic of such metal areas causes a major portion of light passing through the photosensitive resist layer which impinges on the reflective metal areas to be reflected back through the resist layer. Generally, about 70 to 90 percent of the light initially passing through the resist layer is reflected back and very little, if any, scattering of light takes place.

In accordance with a preferred embodiment of the invention, a relatively thin layer of metal is applied onto the resist layer prior to exposure to light. This superimposed metal layer is of a thickness sufficient to reflect, to some degree, a portion of the irradiating light but is of a sufficient thinness to allow a portion of the irradiating light to pass through it. The amount or percentage of light passing through the superimposed metal layer is not overly critical, since radiation of sufficient intensity can be easily provided. The advantage of this embodiment is that a substantial portion of the light which has passed through the superimposed metal layer and which is of equal high intensity at all portions of the irradiated surface, passes through the resist areas corresponding to the discrete metal structures several times due to multiple reflections, but substantially only once in the resist areas corresponding to the free (i.e. not covered by metal) semiconductor surface parts. This repeated passage of light only through select resist areas insures that all of the very precise details of the metal areas on the semiconductor surface are completely and faithfully reproduced in the overlying resist areas. After such overlying resist areas are sufficiently exposed and removed, all of the precise details of the underlying metal areas directly on the semiconductor surface are unmasked for deposition of a further material thereon, such as by electrolytical or galvanic deposition of a metal. By regulating the deposition process, the initially very thin metal areas are thickened or built-up sufficiently to decrease their electrical resistance.

The metal layer superimposed onto the resist layer prior to exposure thereof to light is relatively thin and has a thickness dimension in the order of a wavelength of light. Accordingly, it is preferable to utilize a non-monochromatic light source, i.e. a white light source for exposing the select resist areas so as to avoid producing a locally different degree of solubility in the exposed resist areas, which might occur due to interfering effects resulting from locally different thicknesses in the resist layer.

The metal layer that is applied onto the resist layer is removed after exposure of the resist, for example, simultaneously with the exposed resist layer portions, i.e. those portions of the resist which become soluble by the exposure process.

Referring now to the drawings, wherein like reference numerals throughout the various Figures refer to like elements and which illustrate a semiconductor sample undergoing various process steps in accordance with the invention, FIG. 1 shows a portion of a semiconductor sample or substrate 1, composed for example of gallium arsenide, having a plurality of discrete precisely defined and extremely detailed islands or structural areas 2 thereon, comprised of thin metal layers which are composed of a highly reflective metal such as chromium. Such discrete islands or areas 2 are thickened by the invention.

Figure 2:
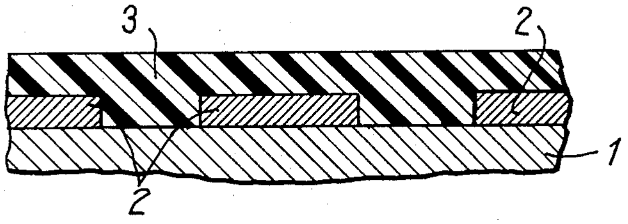
FIG. 2 is a diagrammatically sectioned partial view of a such a semiconductor sample undergoing a process step of one embodiment of the invention.

FIG. 2 illustrates the semiconductor sample 1 after it has been coated with layer 3 of a photosensitive resist material. The layer 3 has a thickness of about 150 to 200 nm.

In accordance with one embodiment of the invention, white light is controllably irradiated onto the resist layer 3 so that the overlying areas of the resist layer corresponding to the detailed chromium areas 2 are subjected to a multiple passage of such light by the reflection of the light from the chromium areas, thereby rendering such overlying resist areas soluble to a select developer. The exposed resist areas (i.e. those subjected to a multiple passage of light) are then removed by a suitable developer or solvent so as to uncover the metal islands 2 on the semiconductor surface. The resist material on the areas of semiconductor surface not covered by the islands 2 is not exposed and remains on the sample 1.

Figure 4:
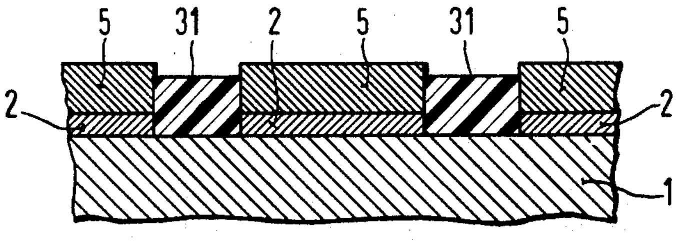
FIG. 4 is a view somewhat similar to FIGS. 2 and 3 of a semiconductor sample undergoing a further step of the embodiments of the invention.
Figure 5:
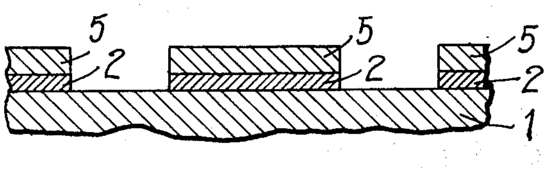
FIG. 5 is a diagrammatically sectioned partial view of a semiconductor sample having built up discrete areas of metal thereon formed in accordance with the principles of the invention.

As shown in FIG. 4, a thickening layer 5 is then applied, as by an electrolytic process onto the precise metal islands 2, thereby thickening such islands. The remaining unexposed resist layer areas 31 are then removed in a known manner to provide a semiconductor element, such as shown in FIG. 5. If desired, the formed semiconductor element can be divided into smaller elements, each of which has at least one reinforced Schottky-Barrier contact thereon.

Figure 3:
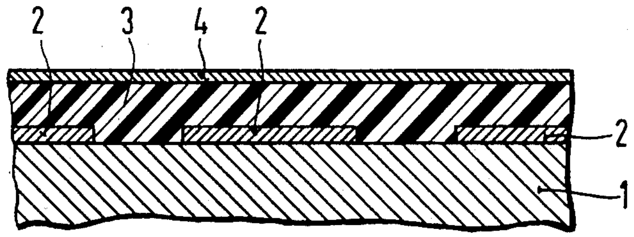
FIG. 3 is a view somewhat similar to FIG. 2, of a semiconductor sample undergoing a process step of another embodiment of the invention.

In another embodiment of the invention, a portion of which is illustrated at FIG. 3, the unexposed photosensitive resist layer 3 is overcoated with a thin metal layer 4. The metal layer 4 is partially light-permeable and reflective so that some light irradiated thereon passes through the metal layer and into the underlying resist layer. The resist layer 3 has a thickness of about 150 to 200 nm and the metal layer 4 has a thickness of about 20 nm. Light of a selected intensity is then irradiated onto metal layer 4 and uniformly penetrates this layer and passes into the resist layer 3. Parts or areas of the resist layer 3 overlying metal islands 2 experience a multiple passage of light due to the upward reflection from the metal islands 2 and the downward reflection from the superimposed areas of metal layer 4 and are thus exposed or rendered soluble. These soluble areas of the resist layer 3 are then removed to uncover only the extremely detailed metal islands 2. The metal layer 4 is removed, either concurrently with the removal of soluble resist areas or separately therefrom. As shown in FIG. 4, the remaining unexposed resist layer areas 31 completely and precisely mask the semiconductor surface areas free of metal islands 2. The exposed metal islands 2 can now be thickened as by galvanically applying a metal layer 5 thereon without depositing any matter on the free semiconductor surface areas. The layer 5 is selected of a material depending on the intended function of the formed semiconductor element, for example, for increasing the electric conductivity thereof and/or for protection of such structure. The thickening composed of a material selected in accordance with the intended function and is generally a metal, such as gold, silver, copper, etc.

As shown in FIG. 5 the unexposed resist layer areas 31 are then removed and the formed structure is ready for use.

The principles of the invention are readily applicable to automatic methods of masking or temporarily protecting small extremely detailed non-metallized surface areas located between precisely defined extremely detailed metal areas on a semiconductor substrate. Such automatic aspects of the invention are especially attractive in building-up or thickening extremely fine metal areas on semiconductor substrates.

Modifications, variations and changes may be made to the described embodiments without departing from the spirit and scope of the novel concepts of the invention.

I claim:

1. A method of covering select areas of a semiconductor surface having discrete light-reflective precisely defined metal areas in direct contact with said surface, which select areas are free of metal, comprising the steps of;

applying a substantially uniform layer of a photosensitive negative-resist material on said semiconductor surface including said select areas and said metal areas, said resist material being characterized as soluble in a developer therefor prior to exposure of light and becoming insoluble in said developer after exposure of light;

exposing said layer to light irradiation for a duration and of an intensity and wavelength sufficient to penetrate said layer and be reflected back from said metal areas so that the multiple passage of said light through said resist material overlying said metal areas renders the resist material over said areas insoluble to said developer; and removing the resist material which remains soluble by subjecting the exposed layer to said developer.

2. A method of covering select areas of a semiconductor surface having discrete light-reflective precisely defined metal areas in direct contact with said surface, which select areas are free of metal, comprising the steps of;

applying a substantially uniform layer of a photosensitive positive-resist material on said semiconductor surface including said select areas and said metal areas, said resist material being characterized as insoluble in a developer therefor prior to exposure to light and becoming soluble in said developer after exposure to light;

exposing said layer to light irradiation for a duration and of an intensity and wavelength sufficient to penetrate said layer and be reflected back from only said metal areas so that the multiple passage of said light through said resist material overlying said metal areas renders the resist material over said areas soluble to said developer; and removing the resist material rendered soluble by subjecting the exposed layer to said developer.

3. A method as defined in claim 2 including electrolytically depositing a metal onto the uncovered metal areas in direct contact with said semiconductor surface.

4. A method as defined in claim 3 wherein the electrolytic deposition comprises a galvanic deposition and said metal is selected from the group consisting of gold, silver and copper.

5. A method as defined in claim 2, including applying a layer of a metal onto the layer of photoresist material prior to exposing said photoresist material to light, said metal layer being of at thickness dimension sufficient to pass at least a portion of irradiated light impinging on its outer surface and to reflect light that passes through the resist material and is reflected upwardly by the metal areas on the semiconductor surface.

6. A method as defined in claim 5 wherein the layer of metal applied onto the layer of resist material is removed with the removal of the resist material rendered soluble.

7. A method as defined in claim 5 including electrolytically depositing a metal onto the uncovered metal areas in direct contact with said semiconductor surface.

8. A method as defined in claim 7 wherein the electrolytical deposition comprises a galvanic deposition and said metal is selected from the group consisting of gold, silver and copper.

* * * * *